United States Patent
Mori et al.

(10) Patent No.: US 10,909,278 B2
(45) Date of Patent: *Feb. 2, 2021

(54) SIMULATION DEVICE, SIMULATION METHOD, CONTROL PROGRAM AND RECORDING MEDIUM

(71) Applicant: OMRON Corporation, Kyoto (JP)

(72) Inventors: Yasumoto Mori, Joyo (JP); Mamoru Egi, Otsu (JP); Yasushi Ohno, Kusatsu (JP); Shota Miyaguchi, Nara (JP); Yasutomo Kawanishi, Kusatsu (JP)

(73) Assignee: OMRON Corporation, Kyoto (JP)

( * ) Notice: Subject to any disclaimer, the term of this patent is extended or adjusted under 35 U.S.C. 154(b) by 763 days.

This patent is subject to a terminal disclaimer.

(21) Appl. No.: 15/409,542

(22) Filed: Jan. 19, 2017

(65) Prior Publication Data
US 2017/0262573 A1    Sep. 14, 2017

(30) Foreign Application Priority Data

Mar. 14, 2016  (JP) ................................. 2016-049314

(51) Int. Cl.
*G06G 7/48* (2006.01)
*G06F 30/17* (2020.01)
(Continued)

(52) U.S. Cl.
CPC ........... *G06F 30/17* (2020.01); *G05B 13/044* (2013.01); *G05B 17/02* (2013.01); *G06F 17/14* (2013.01);
(Continued)

(58) Field of Classification Search
CPC .... G05B 13/042; G05B 13/044; G05B 17/02; G05B 2219/42154; G05B 2219/42155;
(Continued)

(56) References Cited

U.S. PATENT DOCUMENTS 4,876,494 A * 10/1989 Daggett ............. G05B 19/4141
318/568.22
5,172,312 A * 12/1992 Iino ........................ G05B 17/02
700/29
(Continued)

FOREIGN PATENT DOCUMENTS

| CN | 1529932 | 9/2004 |
|---|---|---|
| CN | 1674429 | 9/2005 |

(Continued)

OTHER PUBLICATIONS

"Search Report of Europe Counterpart Application," dated Aug. 7, 2017, p. 1-p. 9, in which the listed references were cited.

(Continued)

*Primary Examiner* — Rehana Perveen
*Assistant Examiner* — Nithya J. Moll
(74) *Attorney, Agent, or Firm* — JCIPRNET

(57) ABSTRACT

The present invention easily displays a frequency response and a time response to a user. The simulation device of the present invention comprises: a frequency response function computing part (53) computing a frequency response function according to a measured value of a response of a mechanical system (7), a time response outputting part (44) executing time response simulation, a frequency response outputting part (45) outputting a frequency response characteristic and a display control part (26) displaying the time response simulation and frequency response characteristic simultaneously or selectively.

9 Claims, 9 Drawing Sheets

(51) Int. Cl.
  *G05B 17/02* (2006.01)
  *G05B 13/04* (2006.01)
  *G06F 17/14* (2006.01)
(52) U.S. Cl.
  CPC .. *G05B 13/042* (2013.01); *G05B 2219/42154* (2013.01); *G05B 2219/42155* (2013.01); *G05B 2219/42163* (2013.01)
(58) Field of Classification Search
  CPC .......... G05B 2219/42163; G06F 17/14; G06F 17/5086
  See application file for complete search history.

(56) References Cited

U.S. PATENT DOCUMENTS

| | | | |
|---|---|---|---|
| 5,453,736 A | 9/1995 | Noren | |
| 5,475,291 A | 12/1995 | Yoshida et al. | |
| 5,859,774 A * | 1/1999 | Kuzuya | B62D 7/159 180/197 |
| 6,198,246 B1 * | 3/2001 | Yutkowitz | G05B 11/42 318/561 |
| 6,256,545 B1 * | 7/2001 | Kimura | F16F 13/26 381/71.4 |
| 2004/0090198 A1 * | 5/2004 | Kaku | B25J 9/163 318/432 |
| 2005/0211198 A1 * | 9/2005 | Froeschle | F02D 41/20 123/90.11 |
| 2009/0230912 A1 | 9/2009 | Umeda et al. | |

FOREIGN PATENT DOCUMENTS

| | | |
|---|---|---|
| CN | 101656507 | 2/2010 |
| CN | 102612673 | 7/2012 |
| CN | 103180790 | 6/2013 |
| CN | 103190074 | 7/2013 |
| CN | 104932260 | 9/2015 |
| CN | 204679101 | 9/2015 |
| CN | 107193217 | 9/2017 |
| EP | 0379215 | 7/1990 |
| EP | 1313207 | 5/2003 |
| EP | 2157489 | 2/2010 |
| JP | H02190902 | 7/1990 |
| JP | H06319284 | 11/1994 |
| JP | H0783977 | 3/1995 |
| JP | H09269804 | 10/1997 |
| JP | 2006-340480 | 12/2006 |
| JP | 2008217055 | 9/2008 |
| JP | 2009-122779 | 6/2009 |
| JP | 2010051061 | 3/2010 |
| JP | 4698656 | 6/2011 |
| WO | 2008065836 | 6/2008 |

OTHER PUBLICATIONS

"Office Action of Japan Counterpart Application," dated Aug. 28, 2018, with English translation thereof, pp. 1-7.

Chen Qi-Ming et al; "Modeling and Simulation of Vector Control System of Alternating Current Motor Basedon Matlab/Simulink", China Academic Journal Electronic Publishing House, vol. 38, No. 5, May 2010, pp. 0740-0745.

Zhu Jianbo, "Simulation and analysis on BLDCM control system", China Academic Journal Electronic Publishing House, vol. 32, No. 12, Dec. 2013, pp. 25-30.

"Office Action of China Counterpart Application," with English translation thereof, dated Nov. 21, 2019, p. 1-p. 12.

* cited by examiner

Basic structure of simulation system

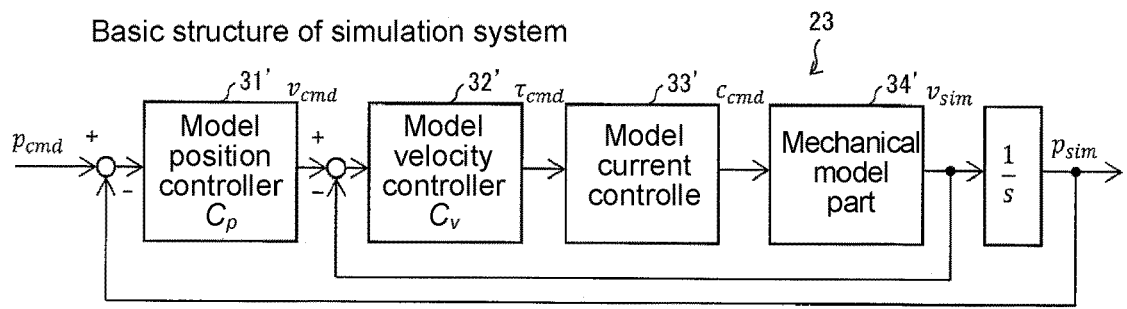

FIG. 8a

Simulation-0: a condition of replacing all control blocks of a simulation system with one frequency transfer function for simulation

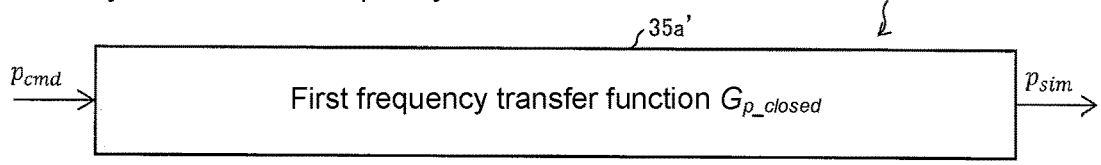

FIG. 8b

Simulation-1: a condition of replacing a model velocity controller, a model current controller and a mechanical model part of the simulation system with one frequency transfer function for simulation

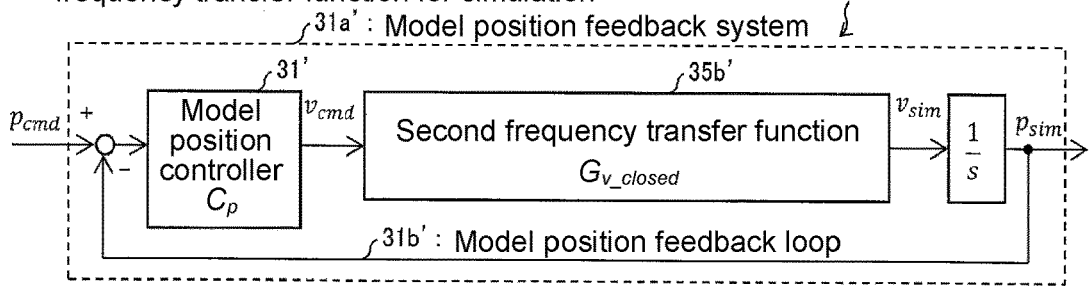

FIG. 8c

Simulation-2: a condition of replacing a model current controller and a mechanical model part of the simulation system with one frequency transfer function for simulation

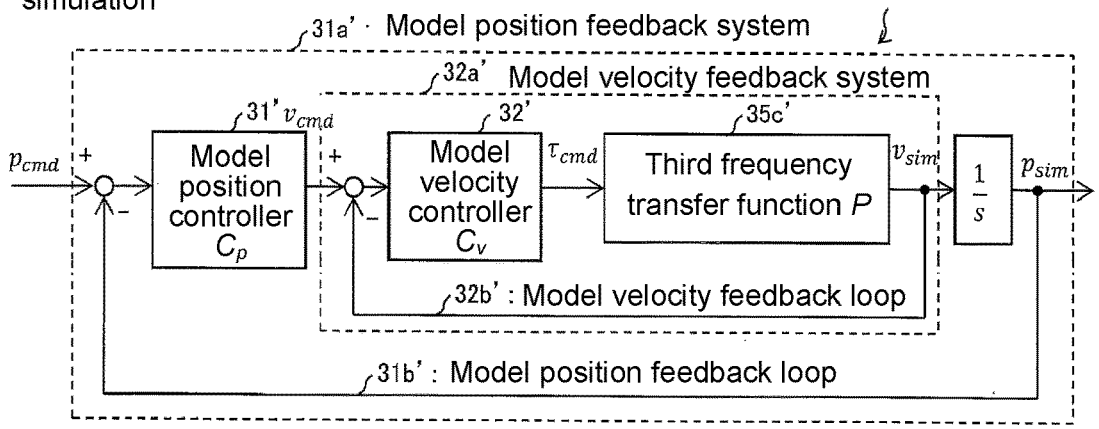

FIG. 8d

SIMULATION DEVICE, SIMULATION METHOD, CONTROL PROGRAM AND RECORDING MEDIUM

CROSS-REFERENCE TO RELATED APPLICATION

This application claims the priority benefit of Japan application no. 2016-049314, filed on Mar. 14, 2016. The entirety of each of the above-mentioned patent applications is hereby incorporated by reference herein and made a part of this specification.

BACKGROUND OF THE INVENTION

1. Field of the Invention

The present invention relates to a simulation device, which simulates a response of a servo driver of a motor controlling and driving a load device.

2. Description of Related Art

In a servo mechanism, in order to properly control the motor for driving a load device, generally, control parameters (position gain, velocity gain, a cut off frequency of a filter, etc.) of the servo driver controlling the motor are adjusted generally.

In the past, in adjusting methods of the control parameters, there is an adjusting method of actually operating the load device through driving the motor. That is, a certain control parameter is set to the servo driver to actually drive the motor, and a response of the load device at this point is measured. At this point, when a response state of the load device does not meet a required condition, the control parameter is changed and the motor is driven again, and the response of the load device at this point is measured. By changing the control parameter in this way and driving the motor repeatedly, the load device is operated, and thus the control parameter is set (for example, patent document 1).

Besides, except for the method of actually operating the device to set the control parameter, there is a method of setting the control parameter through simulation. That is, a physical model of the servo driver and the load device is used to set the control parameter for simulation. Besides, the control parameter is set according to a fact whether the response state obtained as a simulation result meets the required condition (for example, patent document 2).

Besides, a method of adjusting control parameters in an output filter is disclosed in patent document 3. Speaking in more detail, patent document 3 discloses a method, which displays a sum of an amplitude characteristic of a frequency response of the output filter and that of the frequency response of a load device, and adjusts the control parameters of the output filter.

PRIOR TECHNICAL DOCUMENTS

Patent Document

Patent document 1: Japanese Patent laid open No. 2009-122779 gazette (published on Jun. 4, 2009)

Patent document 2: Japanese Patent laid open No. 2006-340480 gazette (published on Dec. 14, 2006)

Patent document 3: International publication No. 2008/065836 (published on Jun. 5, 2008)

SUMMARY OF THE INVENTION

Problem to be Solved by the Invention

However, in the prior art disclosed in the patent document 3, the displayed characteristic is merely a sum of the amplitude characteristics of respective frequency responses of the load device and the output filter. Therefore, although the control parameters of the output filter can be adjusted, the control parameters of a velocity controller and a position controller cannot be adjusted. This is because the response characteristics of velocity control and position control cannot be confirmed.

In other words, in the prior art disclosed in patent document 3, only the frequency response (that is, only a Bode line graph is displayed) can be simulated, and a time response (position and velocity) cannot be simulated.

The present invention is finished in view of the problem, and aims to realize a simulation device, which can easily display the frequency response and the time response to a user.

Technical Means Solving the Problem

In order to solve the problem, the simulation device of the present invention simulates a mechanical system, the mechanical system has a controlled object containing a motor and a motor control device controlling the motor, the simulation device is characterized by comprising: a frequency response function computing part, computing a frequency response function containing characteristics of the controlled object based on a relation between a first command value driving the mechanical system and a measured value of the response of the mechanical system driven by the first command value; a simulation system, having a control block structure corresponding to the mechanical system; a parameter setting part, setting the control parameter changing the characteristics of the simulation system; a frequency transfer function setting part, setting a frequency transfer function computed based on the frequency response function or based on the frequency response function and the control parameter into a frequency transfer function for simulation; a second command value generating part, generating a second command value for simulation; a time response outputting part, executing time response simulation of the mechanical system relative to the second command value based on the second command value and the frequency transfer function for simulation; a frequency response outputting part, outputting the frequency response characteristic of the mechanical system based on the frequency transfer function for simulation; and a display control part, displaying a result of the time response simulation and the frequency response characteristic on a display part simultaneously or selectively.

According to the constitution, the simulation result of the time response characteristic and the frequency response characteristic can be displayed simultaneously. Therefore, the user can easily learn the response characteristic of the controlled object according to the simulation result of the time response characteristic, and the user can easily learn an adjusting degree of the control parameters according to the frequency response characteristics.

Besides, not only is the characteristic of the servo driver used, but also the characteristic, i.e., the frequency transfer function, of the controlled object is used to execute simulation, therefore, the simulation focusing on individuality of the controlled object can be executed and a more accurate simulation result can be obtained.

In the simulation device of the present invention, optionally, the time response outputting part outputs a result of the time response simulation of at least any one of a position, velocity and torque of the mechanical system as a result of the time response simulation.

According to the constitution, the result of the time response simulation can be output, such that the user can learn at least any one of the position, velocity and toque of the mechanical system. In addition, the so-called position, velocity and torque of the mechanical system for example are the position, velocity or motor torque of a load device contained in the mechanical system.

In the simulation device of the present invention, optionally, the frequency response outputting part outputs at least one of a gain response characteristic and a phase response characteristic relative to the second command value as the frequency response characteristic.

According to the constitution, the frequency response characteristic can be output, such that the user can learn at least any one of the gain response characteristic and the phase response characteristic relative to the second command value.

In the simulation device of the present invention, optionally, the mechanical system has a position feedback system containing a position controller and a velocity feedback system containing a velocity controller configured on a downstream side of the position controller as the control block structure, the simulation system has a model position feedback system corresponding to the position feedback system and a model velocity feedback system corresponding to the velocity feedback system, and the frequency response outputting part outputs the frequency response characteristic of at least any one of a velocity open-loop characteristic, a velocity closed-loop characteristic, a position open-loop characteristic and a position closed-loop characteristic as the frequency response characteristic.

According to the constitution, the frequency response characteristic of at least any one of the velocity open-loop characteristic, the velocity closed-loop characteristic, the position open-loop characteristic and the position closed-loop characteristic can be simulated.

In the simulation device of the present invention, optionally, the first command value is a torque command value representing a torque, and the frequency response function computing part computes the frequency response function based on a relation between the torque command value and the response, i.e., a velocity measured value, of the mechanical system driven by the torque command value.

According to the constitution, a torque command for measurement can be used to solve the characteristic, i.e., the frequency response function, of the mechanical system when the motor is actually driven.

In the simulation device of the present invention, optionally, the first command value is a velocity command value representing a velocity, and the frequency response function computing part computes the frequency response function based on a relation between the velocity command value and the response, i.e., a velocity measured value, of the mechanical system driven by the velocity command value.

According to the constitution, the characteristic, i.e., the frequency response function, of the mechanical system when the motor is actually driven is solved by using a velocity command for measurement.

In the simulation device of the present invention, optionally, the first command is a position command value representing a position, and the frequency response function computing part computes the frequency response function based on a relation between the position command value and the response, i.e., a position measured value, of the mechanical system driven by the position command value.

According to the constitution, a position command, i.e., the position command value for measurement can be used to solve the characteristics, i.e., the frequency response function, of the controlled object when the motor is actually driven.

The simulation device of the present invention also comprises an impulse response computing part, computing an impulse response by performing inverse Fourier transform on the frequency transfer function for simulation, and the time response outputting part executes the time response simulation based on the second command value and the impulse response.

According to the constitution, unlike the condition of preparing a model of the controlled object as a physical model and using the model, the simulated controlled object is limited to a form of the model or times. Therefore, a range of the simulated object is expanded, and the phenomenon that the precision of a simulation result is reduced caused by deviation of the actual controlled object from the form of the physical model can be prevented. Further, the response result can be confirmed without a need to have the knowledge related to the control parameters of the servo driver, and the user is not required to have much knowledge.

In order to solve the problem, a simulation method of the present invention performs simulation of a mechanical system, the mechanical system has a controlled object containing a motor and a motor control device controlling the motor, and the simulation method is characterized by comprising: a frequency response function computing step, computing a frequency response function containing characteristics of the controlled object based on a relation between a first command value driving the mechanical system and a measured value of the response of the mechanical system driven by the first command value; a parameter setting step, setting the control parameter changing the characteristics of a simulation system having a control block structure corresponding to the mechanical system; a frequency transfer function setting step, setting a frequency transfer function computed based on the frequency response function or based on the frequency response function and the control parameter into a frequency transfer function for simulation; a second command value generating step, generating a second command value for simulation; a time response outputting step, executing time response simulation of the mechanical system relative to the second command value based on the second command value and the frequency transfer function for simulation; a frequency response outputting step, using the frequency transfer function for simulation to output the frequency response characteristic of the mechanical system; and a display control step, displaying a result of the time response simulation and the frequency response characteristic on a display part simultaneously or selectively.

According to the method, the effects same as the aforesaid effects can be achieved.

The simulation device in various forms of the present invention can be realized by a computer, at this point, a control program realizing the simulation device by using the computer through using the computer as each part (software elements) disposed on the simulation device for actuation of the simulation device, and a recording medium recording the program and capable of being read by the computer also fall within a scope of the present invention.

Effects of the Invention

According to the present invention, the simulation result of the time response characteristic and the frequency response characteristic can be displayed simultaneously.

Therefore, the following effects are achieved: the user can easily learn the response characteristic of the controlled object according to the simulation result of the time response characteristic, and the user can easily learn an adjusting degree of the control parameters according to the frequency response characteristic.

Besides, not only is the characteristic of the servo driver used, but also the characteristic, i.e., the frequency transfer function, of the controlled object is used to execute simulation, therefore, the simulation focusing on individuality of the controlled object can be executed such that a more accurate simulation result can be obtained.

BRIEF DESCRIPTION OF THE DRAWINGS

FIGS. 8a to 8d are block diagrams illustrating a simulation system, FIG. 8a is a diagram illustrating a basic structure of the simulation system, FIG. 8b is a diagram when all control blocks of the simulation system are replaced with a frequency transfer function for simulation, FIG. 8c is a diagram when a model velocity controller, a model current controller and a mechanical model part of the simulation system are replaced with a frequency transfer function for simulation, and FIG. 8d is a diagram when a model current controller and a mechanical model part of the simulation system are replaced with a frequency transfer function for simulation.

DESCRIPTION OF THE EMBODIMENTS

Embodiment 1

[Summary of Control System 100]

Figure 1:
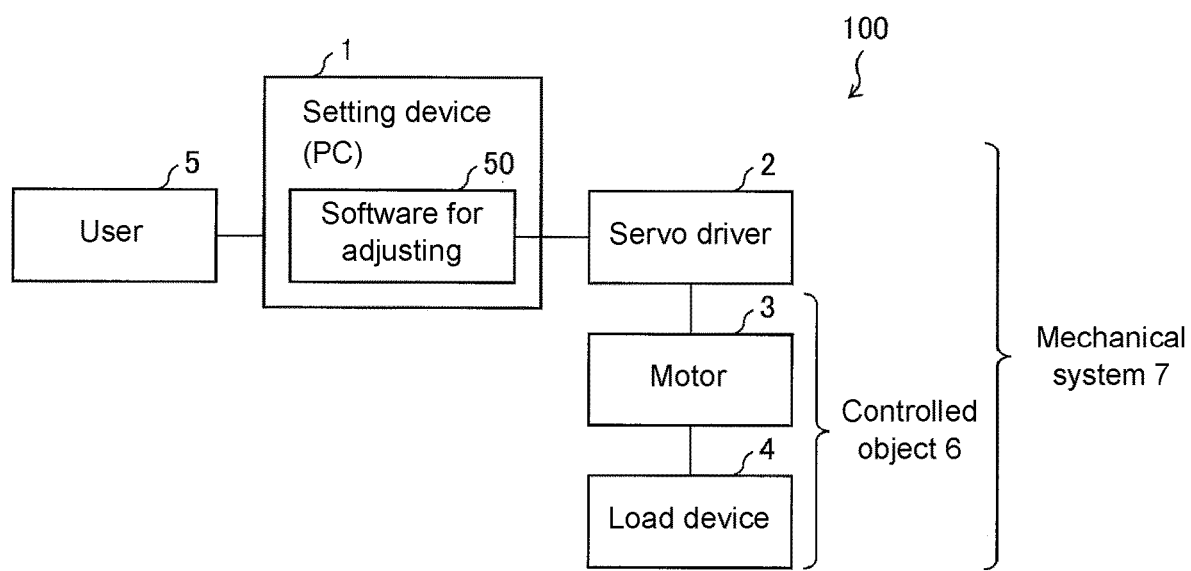
FIG. 1 is a diagram illustrating a control system of the present embodiment.

Hereinafter, embodiment 1 is explained based on FIGS. 1-9a and 9b. At first, the control system 100 of the present embodiment is explained with reference to FIG. 1. FIG. 1 is a diagram illustrating summary of the control system 100. The control system 100 uses a servo mechanism to control a load device 4 to actuate, and as shown in FIG. 1, comprises a setting device (simulation device) 1, a servo driver (motor controller) 2, a motor (driving part) 3 and the load device 4. Besides, the motor 3 and the load device 4 are together called as a controlled object 6, and the controlled object 6 and the servo driver 2 are called together as a mechanical system 7.

The setting device 1 is configured to set and adjust control parameters of the servo controller 2 and contains adjusting software 50. Specifically speaking, the setting device 1 uses the adjusting software 50 to adjust the control parameters (for example, position gain, velocity gain, cut off frequency of a filter, etc.) of the servo driver 2 such that a response state of the servo driver 2 is optimal. In addition, the adjusting software 50 has a function of measuring the response state of the servo driver 2 and a function of simulating a response of the servo driver 2. The setting device 1 for example is realized by means of a personal computer, and by executing a program (adjusting software 50) stored in the personal computer, the computer is used as the setting device 1 for playing a role.

A user (a user, setter and the like of the control system 100) 5 uses the setting device 1 to set and adjust the control parameters of the servo driver 2. That is, the user 5 uses the adjusting software 50 on the setting device 1 to set and adjust the control parameters of the servo driver 2, such that the response state of the servo driver 2 is optimal. In other words, an actual measurement result and simulation result are used to confirm the response state and adjust the control parameters.

The servo driver 2 stores the control parameters set and adjusted by the setting device 1 and drives the motor 3 according to the control parameters to actuate the load device 4. Besides, the servo driver 2 is connected to the setting device 1 and the motor 3 in a wired or wireless communicating manner. For example, the servo driver 2 is connected to the setting device 1 through a Universal Serial bus (USB) cable. Besides, the servo driver 2 and the motor 3 are connected by for example a special cable.

Besides, in the present embodiment, a measured object is actually measured to obtain a frequency response function, and inverse Fourier transform is performed on a frequency transfer function obtained according to the frequency response function and the control parameters to compute the impulse response, which is used to execute simulation.

Therefore, unlike the condition of preparing a model of the controlled object as a physical model and using the model, the simulated controlled object is limited to a form of the model or times. Therefore, a range of the simulated object is expanded, and the phenomenon that the precision of a simulation result caused by deviation of the actual controlled object from the form of the physical model is reduced can be prevented. Further, the response result can be confirmed without a need to have the knowledge related to the control parameters of the servo driver, and the user is not required to have much knowledge.

[Details of the Setting Device 1 and the Servo Driver 2]

Figure 2:
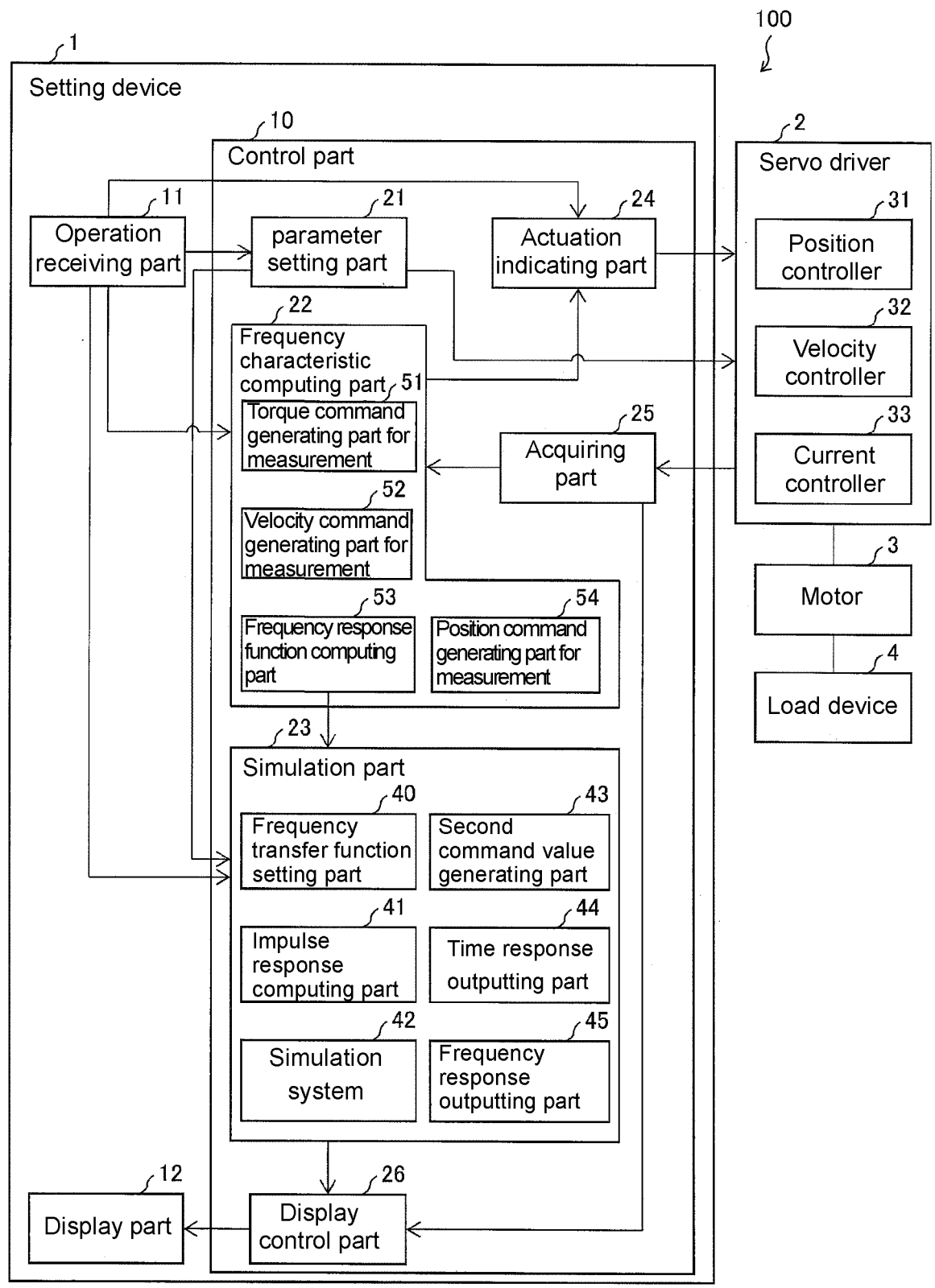
FIG. 2 is a function block diagram illustrating an internal structure of the control system.
Figure 3:
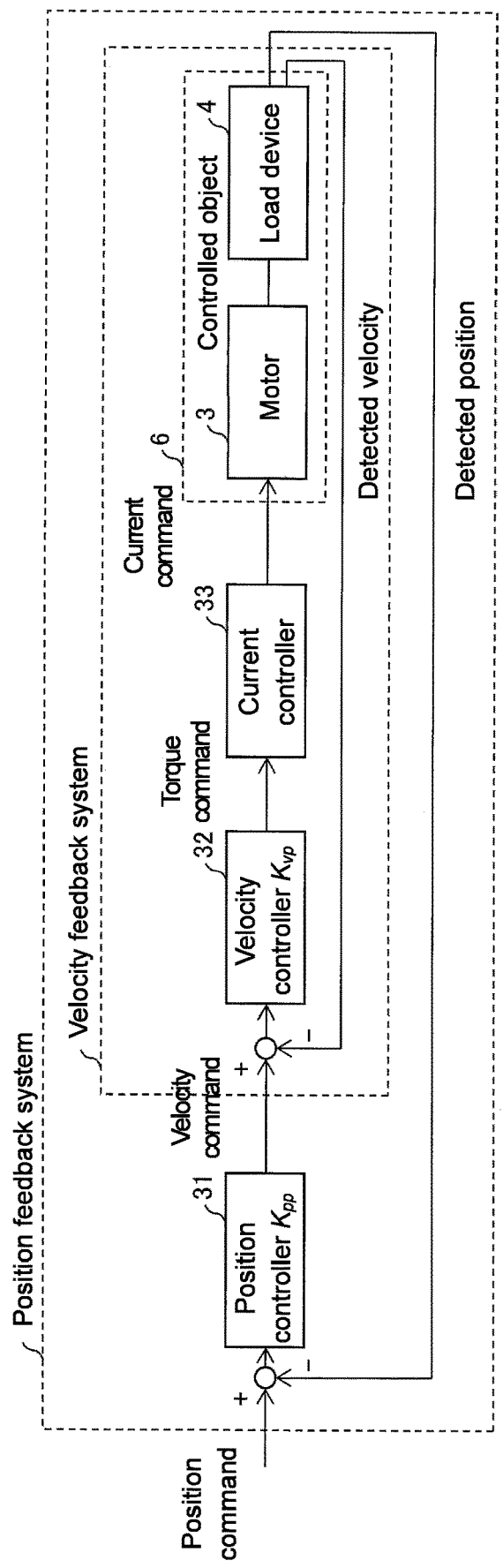
FIG. 3 is a block diagram of a control system of a servo driver.

Then, the constitution of the setting device 1 and the servo driver 2 is explained with reference to FIGS. 2 and 3, FIG. 2 is a block diagram illustrating the constitution of main parts of the setting device 1 and the servo driver 2 contained in the control system 100. Besides, FIG. 3 is a diagram illustrating the structure of control in the servo driver 2.

As shown in FIG. 2, the setting device 1 contains a control part 10, an operation receiving part 11 and a display part 12.

The operation receiving part 11 receives an operation on the setting device 1, and notifies the control part 1o of an operation content. The operation receiving part 11 can contain hardware such as a keyboard and a mouse and can also be matched with a display part 12 mentioned below to contain a touch panel.

Besides, the operation receiving part 11 is used to receive an input value executing the simulation mentioned below, and can also receive some indications instead of the input value, and generate the input value (second command value) in the simulation part 23 according to a received content. At this point, the simulation part 23 becomes a second command value generating part.

The display part 12 displays a setting picture, a simulation result, etc., setting the control parameters of the servo driver 2. In addition, the display part 12 may be not a necessary structure in the setting device 1 and can be located outside the setting device 1. Besides, the display part 12 can, like aforesaid, be constituted as the touch panel containing the functions of the operation receiving part.

The control part 10 executes various processing, comprising simulation of the response of the mechanical system 7 containing the servo driver 2, setting of the parameters of the servo driver 2, etc., in the setting device 1, and the control part 10 contains a parameter setting part 21, a frequency characteristic computing part 22, a simulation part 23, an actuation indicating part 24, an acquiring part 25 and a display control part 26.

The parameter setting part 21 sets the control parameters, received by the operation receiving part 11, of the servo driver 2 to the servo driver 2. Besides, during simulation execution, the simulation part 23 is notified of the control parameters, received by the operation receiving part 11, of the servo driver 2.

The frequency characteristic computing part 22 computes a frequency response function as the characteristics of the controlled object 6 containing the load device 4 when the simulation of the mechanical system 7 containing the servo drive 2 is executed by the simulation part 23 mentioned below. The simulation part 23 is notified of the computed result. The details of the computing method of the frequency response function of the controlled object 6 are mentioned below.

The simulation part 23 uses the frequency response function, computed by the frequency characteristic computing part 22, of the controlled object 6 containing the load device 4 to simulate a response (the time response and position response) of the mechanical system 7 containing the servo driver 2 and displays the result on the display part 12. The details that the simulation part 23 performs the simulation are explained below.

The actuation indicating part 24 sends an actuation indication to the servo driver 2 according to an indication received by the operation receiving part from the user. Specifically speaking, the servo driver 2 is notified of a position command (command of a designated moment and designated position) received by the operation receiving part 11 to indicate the controlled object to arrive at the designated position in the designated moment in the load device 4.

The acquiring part 25 measures a result when the load device 4 is actually operated and notifies the frequency characteristic computing part 22 or display part 12. Speaking in more detail, when the load device 4 is actuated by the indication of the frequency characteristic computing part 22, the acquiring part 25 notifies a measurement result to the frequency characteristic computing part 22. Besides, when the load device 4 is actuated by the indication of the frequency characteristic computing part 22, the acquiring part 25 notifies the display control part 26 of the result and displays the result on the display part 12.

The display control part 26 receives the simulation result (frequency response and time response) of the simulation part 23 from the simulation part 23 and displays on the display part 12. Besides, as abovementioned, an actuation result of the load device is received from the acquiring part 25 and is displayed on the display part 12. In addition, details of the display control part 26 are mentioned below.

Besides, as shown in FIG. 2, the servo driver 2 contains a position controller 31, a velocity controller 32 and a current controller 33. The processing content of these controllers is explained with reference to FIG. 3. FIG. 3 is a diagram illustrating a control structure of the servo driver 2.

As shown in FIG. 3, the position controller 31 for example performs Proportion (P) control. Specifically speaking, by multiplying a deviation, i.e., a position deviation, between a position command notified from the actuation indicating part 24 and a detected position by a position proportion gain, a command velocity is output. In addition, the position controller 31 is set by the parameter setting part 21, therefore, a position proportion gain $K_{pp}$ exists as a control parameter in advance.

The velocity controller 32 for example performs P control. Specifically speaking, by multiplying a deviation, i.e., a velocity deviation, between a velocity command output from the position controller 31 and a detected velocity by a velocity proportion gain, a command torque is output. In addition, the velocity controller 32 is set by the parameter setting part 21, therefore, a velocity proportion gain $K_{vp}$ exists as a control parameter in advance. In addition, the velocity controller 32 can also be subjected to Proportional Integration (PI) control rather than P control. At this point, the velocity controller 32 has a velocity proportion gain $K_{vp}$ and a velocity integration gain $K_{vi}$ as the control parameter.

The current controller 33 outputs a current command based on a torque command output from the velocity controller 32, and the motor 3 is controlled to actuate the load device 4. The current controller 33 contains a torque command filter (once low pass filter) and a plurality of notch filters, and there are cut off frequency of the torque command filter and the frequency of the notch filters as the control parameters.

The system containing the velocity controller 32, the current controller 33 and the controlled object 6 as well as a feedback of the detected velocity to the velocity controller 32 is called as a velocity feedback system, and the system containing the position controller 31 and also containing the feedback of the detected position to the position controller 31 except for the velocity feedback system is called as a position feedback system. Besides, they are called as a feedback system when there is not need to distinguish the velocity feedback system and the position feedback system.

[Details of the Processing in the Frequency Characteristic Computing Part 22]

Figure 5:
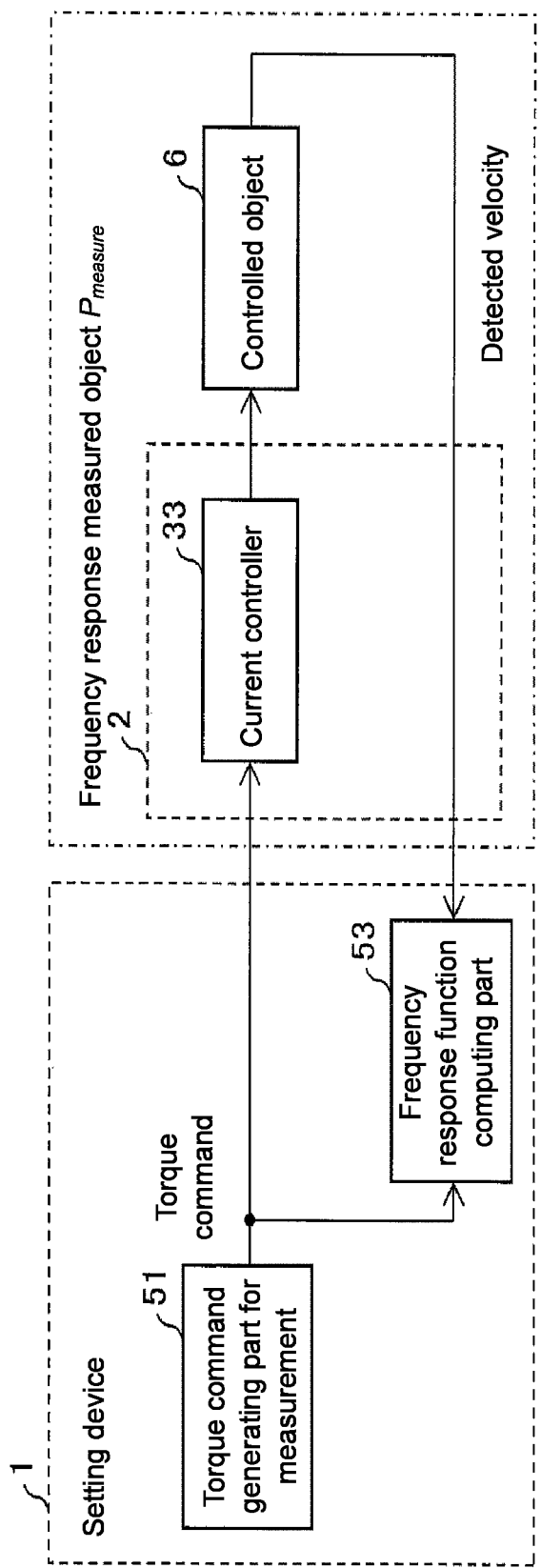
FIG. 5 is a control block diagram of computing a frequency response function according to a torque command for measurement.
Figure 6:
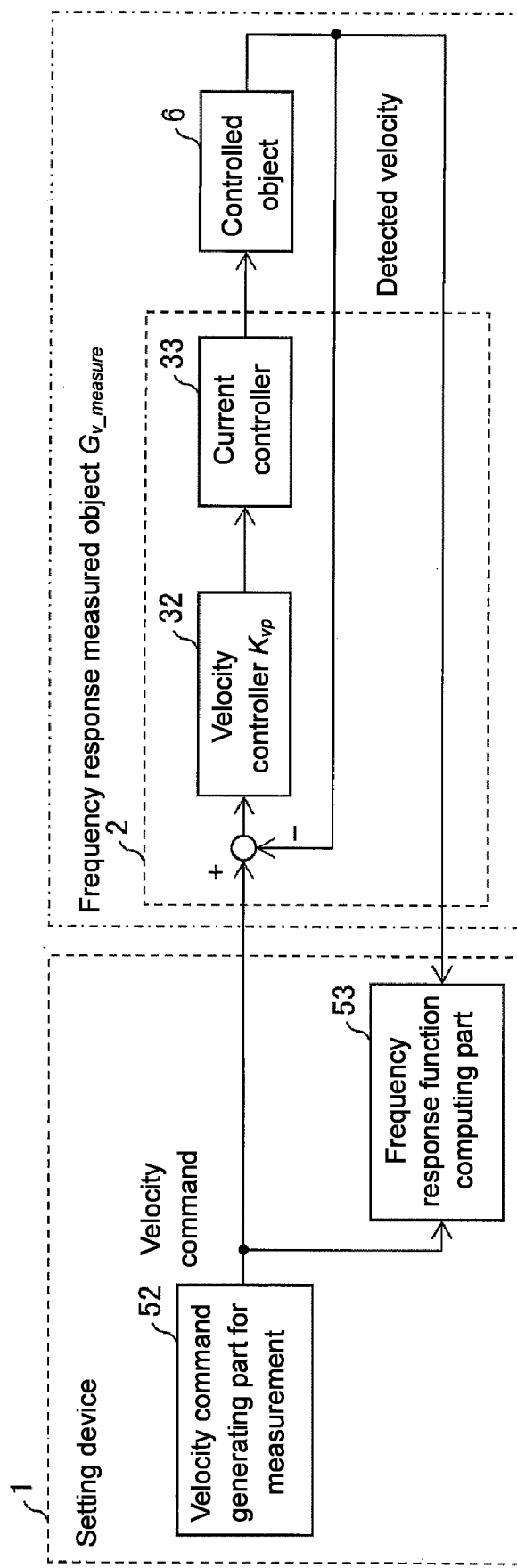
FIG. 6 is a control block diagram of computing a frequency response function according to a velocity command for measurement.
Figure 7:
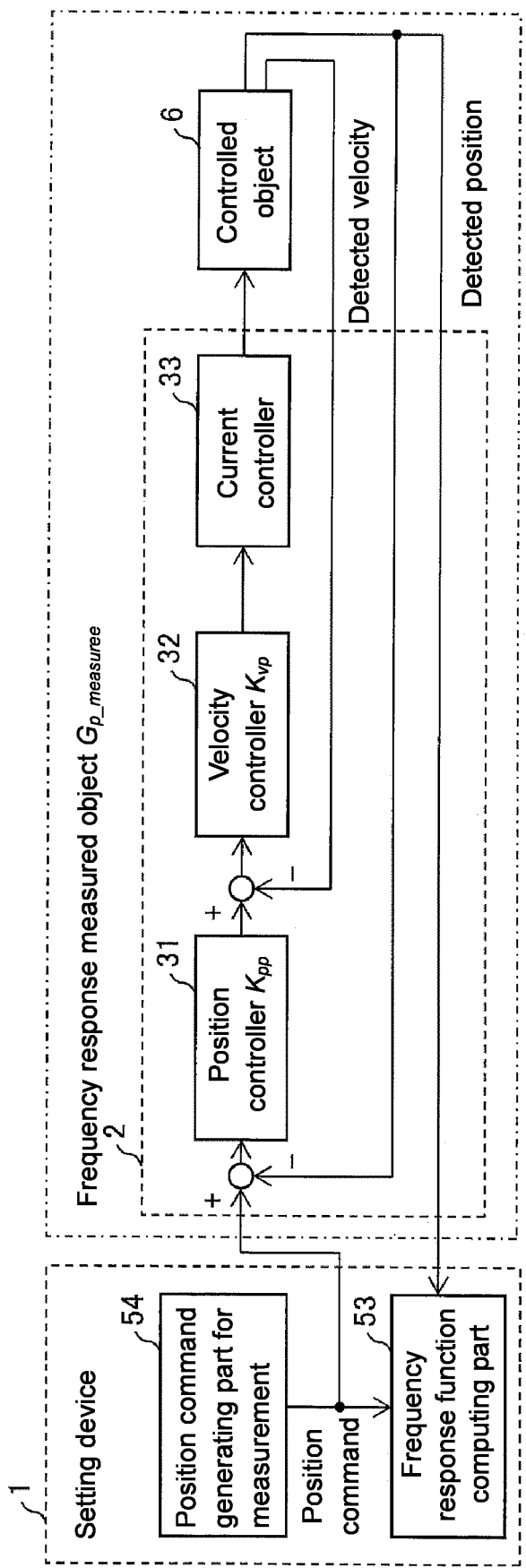
FIG. 7 is a control block diagram of computing a frequency response function according to a position command for measurement.

The details of the processing in the frequency characteristic computing part 22 are explained with reference to FIGS. 5-7. FIG. 5 is a control block diagram when the frequency response function is computed according to the torque command for measurement. FIG. 6 is a control block diagram when the frequency response function is computed according to the velocity command for measurement. FIG. 7 is a control block diagram when the frequency response function is computed according to the position command for measurement.

As shown in FIG. 2, the frequency characteristic computing part 22 contains a torque command generating part 51 for measurement, a velocity command generating part 52 for measurement, a frequency response function computing part 53 and a position command generating part 54 for measurement, and in addition, can also comprise any one or two of the torque command generating part 51 for measurement, the velocity command generating part 52 for measurement and the position command generating part 54 for measurement without needing all of them.

The torque command generating part 51 for measurement generates a torque command for measurement (first command value and torque command value) for driving the motor when the frequency response function of the controlled object 6 containing the load device 4 is solved.

The velocity command generating part 52 for measurement generates a velocity command for measurement (first command value and velocity command value) for driving the motor when the frequency transfer function P of the controlled object 6 containing the load device 4 is solved.

The position command generating part 54 for measurement generates a position command for measurement (first command value and position command value) for driving the motor when the frequency transfer function P of the controlled object 6 containing the load device 4 is solved.

In addition, the present embodiment records the following constitution, that is, the setting device 1 has a torque command generating part 51 for measurement, a velocity command generating part 52 for measurement and a position command generating part 54 for measurement as a function of generating a command value for measuring frequency response. However, the generating method of the command value for measuring the frequency response is not limited thereto. For example, the torque command generating part 51 for measurement, the velocity command generating part 52 for measurement and the position command generating part 54 for measurement can respectively set conditions for generating the command value, and the generation of the command value is performed by the servo driver 2 through notifying the servo driver 2 of the set conditions. As the conditions of generating the command value, for example, when a scan sine wave is used as the command value, an initial amplitude and an amplification rate of the amplitude of the command values can be listed. Besides, a value which can decide a maximum of the frequency of the command value can be set as the condition. The value deciding the maximum of the frequency of the command value for example can be a measurement sampling period. The generating conditions of the command values are set by the user through the operation receiving part 11.

The frequency response function computing part 53 calculates the characteristics, i.e., the frequency response function, of the controlled object 6 containing the load device 4 by using the torque command for measurement, the velocity command for measurement or the position command for measurement generated by the torque command generating part 51 for measurement, the velocity command generating part 52 for measurement or the position command generating part 54 for measurement. A detailed computing method is explained as follows.

[Computing Method-1]

At first, the computing method-1 is explained with reference to FIG. 5. As shown in FIG. 5, in the computing method-1, at first, the torque command generating part 51 for measurement generates a torque command for measurement containing a plurality of frequency components, and notifies the current controller 53 and the frequency response function computing part 53. Then, the current controller 33 drives the motor 3 based on the notified torque command for measurement to actuate the load device 4.

Then, the frequency response function computing part 53 computes the frequency response function of the controlled object 6 containing the load device 4 according to the torque command for measurement notified from the torque command generating part 51 for measurement and a response velocity (detected velocity (velocity measured value and measured value)) in the controlled object 6 containing the load device 4. That is, a measured object $P_{measure}$ of the frequency response function is a block containing the current controller 33 and the controlled object 6.

Specifically speaking, the frequency characteristic computing part 22 computes the frequency response function as mentioned below. At first, as shown below, the torque command for measurement and the measured response velocity data (time sequence arrangement of the sampling interval $\Delta t$ and a data number N) are subjected to frequency analysis (Fourier transform) respectively and a ratio thereof is solved, thus computing the frequency response function P (complex number arrangement).

Tref[N]: complex number arrangement obtained by performing Fourier transform on the torque command for measurement $\Omega$act[N]: complex number arrangement obtained by performing Fourier transform on the response velocity $P[N]=\Omega act[N]/Tref[N]$ $f[N]=0,1/(\Delta t \cdot N),2/(\Delta t \cdot N),3/(\Delta t \cdot N), \ldots ,(N-1)/(\Delta t \cdot N) f$: frequency According to the above, the frequency response function of a measured object $P_{measure}$ containing the current controller 33 and the controlled object 6 is solved.

[Computing Method-2]

Next, the computing method-2 is explained with reference to FIG. 6. As shown in FIG. 6, in the computing method-2, at first, the velocity command generating part 52 for measurement generates a velocity command for measurement containing a plurality of frequency components and notifies the velocity controller 52 and the frequency response function computing part 53. Next, the velocity controller 32 as abovementioned outputs a command torque according to a deviation, i.e., a velocity deviation between the velocity command for measurement and the detected velocity. The current controller 33 actuates the load device 4 based on the notified command torque.

Then, the frequency response function computing part 53 computes the frequency response function of a measured object $G_{v\_measure}$ according to the velocity command for measurement notified by the velocity command generating part 52 for measurement and the measured response velocity (detected velocity) in the load device 4. The determined object $G_{v\_measure}$ is a block containing the velocity controller 32, the current controller 33 and the controlled object 6.

Specifically speaking, the frequency characteristic computing part 22 as mentioned below firstly performs frequency analysis (Fourier transform) on the velocity command for measurement and the measured response velocity data (time sequence arrangement of the sampling interval $\Delta t$ and a data number N) respectively and a ratio thereof is solved, thus computing a velocity closed frequency response function $G_{v\_closed}$ (complex number arrangement).

$\Omega$ref[N]: complex number arrangement obtained by performing Fourier transform on the velocity command for measurement $\Omega$act[N]: complex number arrangement obtained by performing Fourier transform on the response velocity $G_{v\_closed}[N]=(\Omega act[N])/(\Omega ref[N])$ $f[N]=0,1/(\Delta t \cdot N),2/(\Delta t \cdot N),3/(\Delta t \cdot N), \ldots ,(N-1)/(\Delta t \cdot N) f$: frequency Next, as shown below, according to the velocity closed-loop characteristic $G_{v\_closed}$, the characteristic ($C_v$) of the velocity controller 32 of the servo driver 2 during measuring is subjected to division operation, thus solving a frequency response function P of the measured object $G_{v\_measure}$.

$$G_{v\_open}[N]=(G_{v\_closed}[N])/(1-G_{v\_closed}[N])$$

$$P[N]=(G_{v\_open}[N])/C_v[N]$$

By the abovementioned, the frequency response function P of the measured object $G_{v\_measure}$ is solved.

[Computing Method-3]

Next, the computing method-3 is explained with reference to FIG. 7. As shown in FIG. 7, in the computing method-3, at first, the position command generating part 54 for measurement generates a position command for measurement containing a plurality of frequency components and notifies the position controller 31 and the frequency response function computing part 53. Next, the position controller 31 outputs a command torque according to a deviation, i.e., a position deviation between the position command for measurement and the detected position. The velocity controller 32 outputs a command torque according to a deviation, i.e., a velocity deviation between the command velocity and the detected velocity. The current controller 33 actuates the load device 4 based on the notified command torque.

Then, the frequency response function computing part 53 computes the frequency response function of a measured object $G_{p\_measure}$ according to the position command for measurement notified from the position command generating part 54 for measurement and the measured response position (detected position (position measured value and measured value)) in the load device 4. The measured object $G_{p\_measure}$ is a block containing the position controller 31, the velocity controller 32, the current controller 33 and the controlled object 6.

Specifically speaking, the frequency characteristic computing part 22 as mentioned below firstly performs frequency analysis (Fourier transform) on the position command for measurement and the measured response position data (time sequence arrangement of the sampling interval Δt and a data number N) respectively and a ratio thereof is solved, thus computing a position closed frequency response function $G_{p\_closed}$ (complex number arrangement).

θref[N]: complex number arrangement obtained by performing Fourier transform on the position command for measurement θact[N]: complex number arrangement obtained by performing Fourier transform on the response position $$G_{p\_closed}[N]=(\theta act[N])/(\theta ref[N])$$

$$f[N]=0,1/(\Delta t \cdot N),2/(\Delta t \cdot N),3/(\Delta t \cdot N),\ldots,(N-1)/(\Delta t \cdot N)f: \text{frequency}$$

Next, as shown below, the position open-loop characteristic $G_{p\_open}$ is solved according to the position closed-loop characteristic $G_{p\_closed}$.

$$G_{p\_open}[N]=(G_{p\_closed}[N])/(1-G_{p\_closed}[N])$$

Then, as shown below, the characteristic $C_p$ of the position controller 31 is solved according to the value of the control parameter during measuring.

Besides, according to the position open-loop characteristic $G_{p\_open}$, the characteristic of the position controller 31 and the integration item (1/s) are subjected to division operation to solve the velocity closed-loop characteristic.

$$G_{v\_closed}[N]=(G_{p\_open}[N])/(C_p/s)$$

Next, as shown below, according to the velocity closed-loop characteristic $G_{v\_closed}$, the characteristic ($C_v$) of the velocity controller of the servo driver 2 during measuring is subjected to division operation, such that the frequency response function P of the measured object $G_{v\_measure}$ is measured.

$$G_{v\_open}[N]=(G_{v\_closed}[N])/(1-G_{v\_closed}[N])$$

$$P[N]=(G_{v\_open}[N])/C_v[N]$$

As abovementioned, the frequency response function P of the measured object $G_{pv\_measure}$ is solved.

In this way, in the present embodiment, a measurement result obtained by actuating the load device 4 is used to solve the frequency response function of the measured object containing the load device 4. Besides, the frequency response function used to execute the simulation as follows, therefore, high prevision simulation can be executed. Besides, the characteristics (frequency response function) of the measured object containing the load device 4 can be solved according to the measurement result, therefore, the user 5 can execute simulation without the need to have special knowledge for solving the characteristics of the load device 4.

[Detailed of Processing in Simulation Part 23]

Next, the details of the processing in the simulation part 23 are explained with reference to FIGS. 8a to 8d, which are diagrams explaining a simulated content in the setting device 1 of the present embodiment.

As shown in FIG. 2, the simulation part 23 comprises a frequency transfer function setting part 40, an impulse response computing part 41, a simulation system 42, a second command value generating part 43, a time response outputting part 44 and a frequency response outputting part 45.

The frequency transfer function setting part 40 sets a frequency transfer function used for simulation, i.e., the frequency transfer function for simulation according to the frequency response function computed according to the frequency response function computing part 53 or based on the frequency response function or the control parameter for simulation.

The impulse response computing part 41 computes an impulse response of the frequency transfer function for simulation set by the frequency transfer function 40.

The simulation system 42 is a system containing a model structure of a simulation object. Details of the simulation system 42 are mentioned below.

The second command value generating part 43 generates a command value for simulation, i.e., the second command value.

The time response outputting part 44 executes time response simulation and outputs a time response as a simulation result.

The frequency response outputting part 45 outputs a frequency response as the simulation result.

[Basic Structure of the Simulation System]

At first, the basic structure (control block structure) of the simulation system is explained with reference to FIG. 8a. As shown in FIG. 8a, the basic structure of the simulation system corresponds to the mechanical system 7 and contains a model position controller 31', a model velocity controller 32', a model current controller 33' and a mechanical model part 34'.

The model position controller 31' corresponds to the position controller 31 of the servo driver 2, the model velocity controller 32' corresponds to the velocity controller of the servo driver 2, the model current controller 33' corresponds to the current controller 33 of the servo driver 2 and the mechanical model part 34' corresponds to the controlled object 6.

In the basic structure of the simulation system, similar to the servo driver 2, a position command $p_{cmd}$ is input to the model position controller 31' to output a velocity command $v_{cmd}$, a velocity command $c_{cmd}$ is input to the model velocity controller 32' to output a torque command $\tau_{cmd}$, and a torque command is input to the model current controller 33' to output a current command $c_{cmd}$. Besides, a current command is input to the mechanical model part 34' to output a velocity $v_{sim}$ and a position $p_{sim}$ as the simulation result.

[Simulation-0]

In simulation-0, as shown in FIG. 8b, a whole (the model position controller 31', the model velocity controller 32', the model current controller 33' and the mechanical model part 34') of the basic structure as shown in FIG. 8a is used as an object (first frequency transfer function) of inverse Fourier transform for simulation. The specific condition is as follows.

At first, by the processing of the frequency characteristic computing part 22, the frequency response function P of the controlled object 6 containing the load device 4 is solved. Next, the frequency transfer function ($C_p$, $C_v$) as the characteristics of the controller is multiplied by the frequency response function P of the controlled object 6, such that the velocity open frequency transfer function $G_{v\_open}$ and the velocity closed frequency transfer function $G_{v\_closed}$ are solved. Herein, the frequency transfer function ($C_p$, $C_v$) is expressed by the control parameters for simulation. That is, the frequency transfer function $C_p$ is a frequency transfer function expressing the characteristics of the model position control part 31' of the simulation system, and a position proportion gain $K_{pp\_sim}$ for simulation as the control parameter for simulation is set. That is, the frequency transfer function $C_p$ is a function becoming a constant number. Besides, the frequency transfer function $C_v$ is a frequency transfer function expressing the characteristics of the model velocity control part 32' of the simulation system, and a velocity proportion gain $K_{vp\_sim}$ for simulation as the control parameter for simulation is set. Besides, when the model velocity control part 32' performs PI control, in the model velocity control part 32', the frequency transfer function $C_v$ is expressed also by a velocity integration gain $K_{vi\_sim}$ expect for the velocity proportion gain $K_{vp\_sim}$. At this point, the frequency transfer function $C_v$ is expressed as $K_{vp\_sim} \times (1+K_{vi\_sim}/2)$ (a function of a Laplace operator s). Further, the position open frequency transfer function $G_{p\_open}$ and the position closed frequency transfer function $G_{p\_closed}$ are solved.

$G_{v\_open} = C_v \cdot P$ $G_{v\_closed} = (G_{v\_open})/(1-G_{v\_open})$ $G_{p\_open} = C_p \cdot G_{v\_closed} \cdot 1/s$ (s is a variable of the transfer function)

$G_{p\_closed} = (G_{p\_open})/(1+G_{p\_open})$

Next, the position closed frequency transfer function $G_{p\_closed}$ is subjected to inverse Fourier transform to solve an impulse response $g_{imp}$, which expresses a position response relative to a position impulse command.

$g_{imp} = \text{IFFT}(G_{p\_closed})$

Next, the position response (time sequence arrangement $p_{sim}$) relative to the position command (time sequence arrangement $p_{cmd}$) is solved through the following computing. In addition, it is a convolution performing the impulse response $g_{imp}$.

```
FOR repeating m= 0 to a length quantity to be simulated DO
    FOR merely repeating n=0 to a length quantity of g_imp (N) DO
        p_sim[m+n]=p_sim[m+n]+p_cmd[m]·g_imp[n]
    END FOR
END FOR
```

Through the abovementioned, the whole of the basic structure as shown in FIG. 8a is replaced with the frequency transfer function for simulation.

Therefore, the control parameters are changed while the response (position response and time response) of the mechanical system 7 is obtained, such that the motor 3 is actually driven to actuate the load device 4 for confirming the response every time when the control parameter is changed every time.

[Simulation-1]

In simulation-1, compared with the simulation-0, the following aspect is more excellent.

In the frequency response function of the controlled object 6 containing the load device 4 solved by the frequency characteristic computing part 22 according to a detected result, low frequency information is not fully contained. Therefore, time sequence data solved by performing inverse Fourier transform on the computed result will more errors in low frequency components. Specifically, a direct current component is displayed as a constant deviation, therefore, obvious errors are caused. In addition, by prolonging the measurement time, more low frequency information can be obtained, but ease of use is reduced, and a use case is not ideal.

Besides, in simulation-0, a velocity command $v_{cmd}$ does not occur, and the constitution of the velocity command $v_{cmd}$ plus the velocity feedforward cannot be simulated.

Therefore, in simulation-1, a response position is fed back to calculate a position deviation between a command position and a response position, and the position deviation is used to perform convolution on the impulse response obtained by performing inverse Fourier transform on the frequency transfer function to compute the response velocity, and the computed response velocity is subjected to integration to compute a response position, thereby executing the simulation. Therefore, the position deviation is computed by feeding back the response position, therefore, thus the error of the low frequency components is corrected, and high precision simulation can be executed.

Speaking in more detail, explanation is performed with reference to FIG. 8c. FIG. 8c is a diagram for explaining content of simulation-1. As shown in FIG. 8c, in simulation-1, the model velocity controller 32', the model current controller 33' and the mechanical model part 34' in the basic structure of the simulation system are simulated as an object of the inverse Fourier transform. Besides, the model position controller 31' computes a velocity command $v_{cmd}$ according to a position deviation between a position command $p_{cmd}$ and a response position $p_{sim}$ and uses the second frequency transfer function to compute the response velocity $v_{sim}$ according to the computed velocity command $v_{cmd}$, and computes a response position $p_{sim}$ according to the computed response velocity $v_{sim}$. In addition, herein, the computed velocity command $v_{cmd}$ corresponds to an output value output by inputting the position command $p_{cmd}$ (second command value) to the simulation system.

Specifically speaking, computing is performed in a following manner. In addition, the characteristic of the model velocity controller 32' to which the parameter to be simulated is input is set into $C_y$.

At first, the frequency transfer function setting part 40 multiplies Cy by the frequency response function P, computed by the frequency characteristic computing part 22, of the controlled object 6 containing the load device 4 to solve the velocity open frequency transfer function $G_{v\_open}$ and the velocity closed frequency transfer function $G_{v\_closed}$.

$$G_{v\_open}[N] = C_v[N] \cdot P[N]$$

$$G_{v\_closed}[N] = (G_{v\_open}[N])/(1+G_{v\_open}[N])$$

Next, the impulse response computing part 41 performs inverse Fourier transform on the velocity closed frequency transfer function $G_{v\_closed}$ to solve the impulse response $g_{imp}$, which represents a velocity response relative to the velocity impulse command.

$$g_{imp}[N] = \text{IFFT}(G_{v\_closed}[N])$$

Next, the simulation part 23 solves the position response (time sequence arrangement $p_{sim}$) and the velocity response (time sequence arrangement $v_{sim}$) relative to the position command (time sequence arrangement $p_{cmd}$) by the following computing, which is a convolution performing impulse response $g_{imp}$. In addition, $v_{cmd}$ is output from the model position controller 31'.

```
FOR repeating m=0 to length quantity to be simulated DO
  p_err=p_cmd[m]-p_sim[m-1]...computing a position deviation p_err
  v_cmd=K_pp·p_err
  FOR merely repeating n=0 to a length quantity of g_v-imp (N) DO
    v_sim[m+n]=v_cmd·g_imp[n]...convolution
  ENDFOR
  p_sim[m]=p_sim[m-1]+v_sim[m]·Δt...performing integration on the velocity to
  compute a position
ENDFOR
```

Herein, $K_{pp}$ is a position proportion gain (control parameter), and $\Delta t$ is a sampling interval during frequency response measurement.

As abovementioned, in simulation-1, the model velocity controller 32', the model current controller 33' and the mechanical model part 34' in the basic structure as shown in FIG. 8a are taken as the object of inverse Fourier transform, and simulation is executed by using position deviation.

Besides, by using the position deviation, the error of the low frequency components in the frequency response function of the controlled object 6 containing the load device 4 can be reduced, therefore, more accurate simulation can be performed compared with simulation-0.

Besides, the velocity open frequency transfer function ($G_{v\_open}$) and the velocity closed frequency transfer function ($G_{v\_closed}$) are directly taken as a Bode line graph for outputting, therefore, the velocity open or velocity closed frequency response can be simulated.

[Variable Examples]

When the simulation is repeated without changing the parameters of the model velocity controller 32', the velocity closed-loop characteristic (frequency transfer function) $G_{v\_closed}$ is fixed. Therefore, by the aforesaid computing method-2, the velocity closed-loop characteristic (frequency transfer function) $G_{v\_closed}$ is solved, and the solved velocity closed-loop characteristic (frequency transfer function) $G_{v\_closed}$ is used to solve $g_{imp}$ for simulation. It is useful for example only when the parameters of the position controller 31 are changed and only when the position command is changed.

[Processing Flow of Setting Control Parameters in the Setting Device 1]

Figure 4:
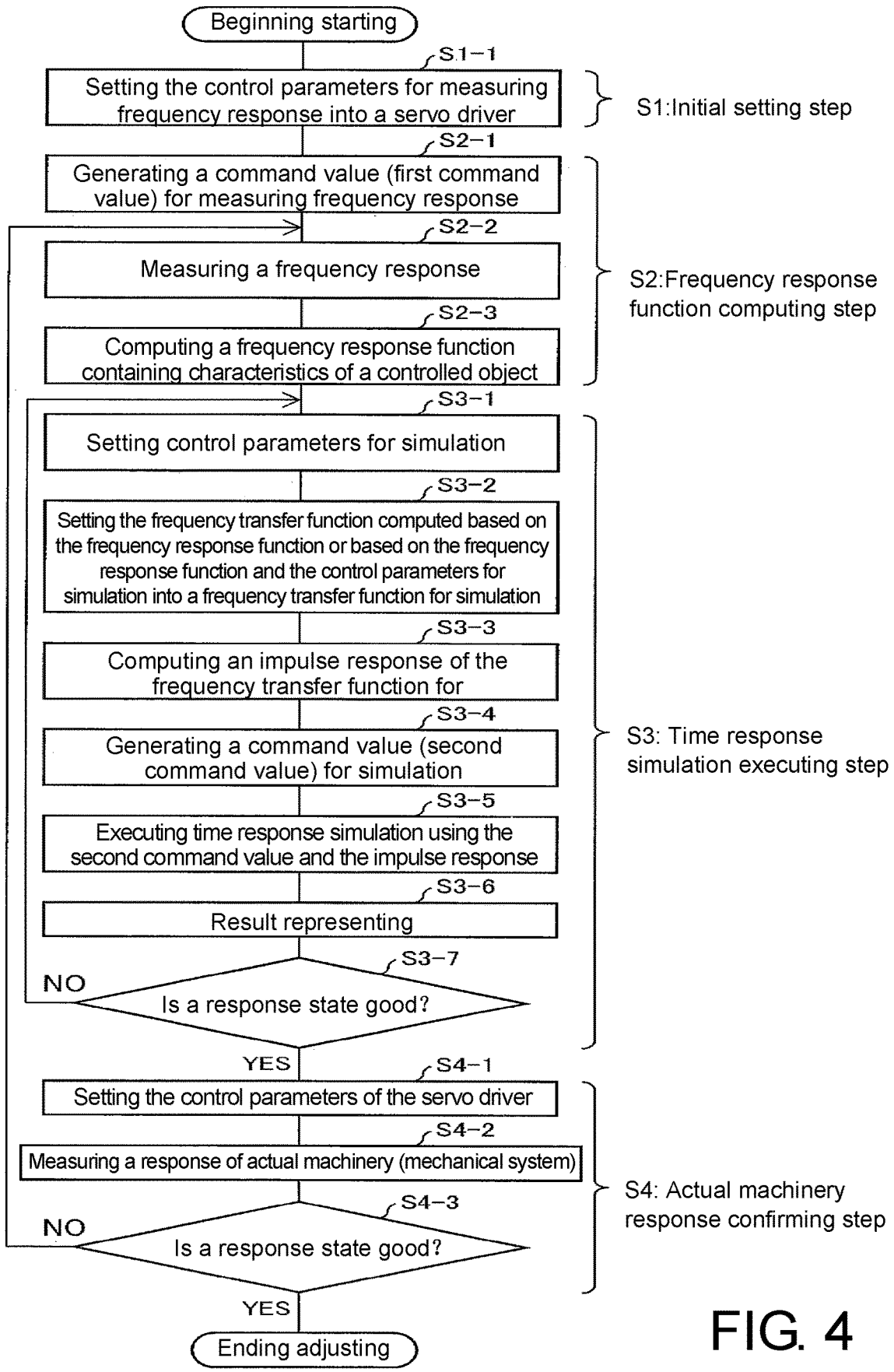
FIG. 4 is a flow chart of a flow of an adjusting method of control parameters.

Next, the processing flow of adjusting (setting) the control parameters in the setting device 1 is explained. FIG. 4 is a flow chart illustrating the processing flow in the setting device 1.

As shown in FIG. 4, in the adjusting processing of the control parameters, as a large flow, initial setting is performed in an initial setting step (S1), the frequency response function is computed in a frequency response function computing step (S2), time response simulation is executed in a time response simulation executing step (S3), and an actual machinery response is confirmed in the actual machinery response confirming step (S4).

In the initial setting step S1, the parameter setting part 21 sets the control parameters for measurement to the servo driver 2 (S1-1).

In the frequency response computing step S2, at first, at least any one of the torque command generating part 51 for measurement, the velocity command generating part 52 for measurement and the position command generating part 54 for measurement generates a command value (first command value) for frequency response measurement (S2-1).

Next, the frequency characteristic computing part 22 measures the frequency response by the acquiring part 25 (S2-2).

Next, the frequency characteristic computing part 22 computes the frequency response function, containing the characteristic of the controlled object 6, of a measured object (S2-3).

In the time response simulation executing step S3, at first, the parameter setting part 21 sets a control parameter for simulation (S3-1).

Next, the frequency transfer function setting part 40 computes a frequency transfer function based on the frequency response function computed in step S2-3 or based on the frequency response function and the control parameter for simulation, and sets into the frequency transfer function for simulation (S3-2).

Next, the impulse response computing part 41 computes an impulse response of the frequency transfer function for simulation in step S3-2 (S3-3).

Next, the second command generating part 43 generates a command value (second command value) for simulation (S3-4).

Next, the time response outputting part 44 uses second command value generated in step S3-4 and the impulse response computed in step S3-3 to execute time response simulation and outputs a result (S3-5).

Besides, the frequency response outputting part 45 uses the frequency transfer function for simulation generated in S3-1 to output at least any one characteristic in the gain response characteristic and the phase response characteristic as the frequency response characteristic (S3-X).

In addition, the frequency transfer function for simulation generated in S3-1 can be used for time response simulation, can be used for computing the frequency response characteristic or others.

Besides, the executing step of time response simulation S(3-5) and the output step of the frequency response characteristic (S3-X) can be performed simultaneously, besides, the output step of the frequency response characteristic can be performed often prior to the execution step of simulation in time.

Figure 9A:
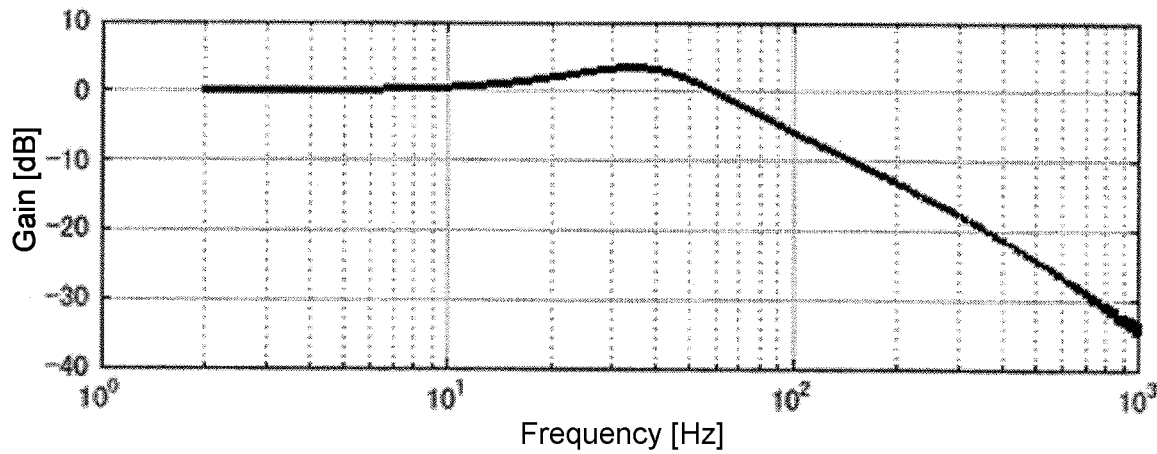
FIGS. 9a and 9b are diagrams illustrating a display example of a frequency response function.
Figure 9B:
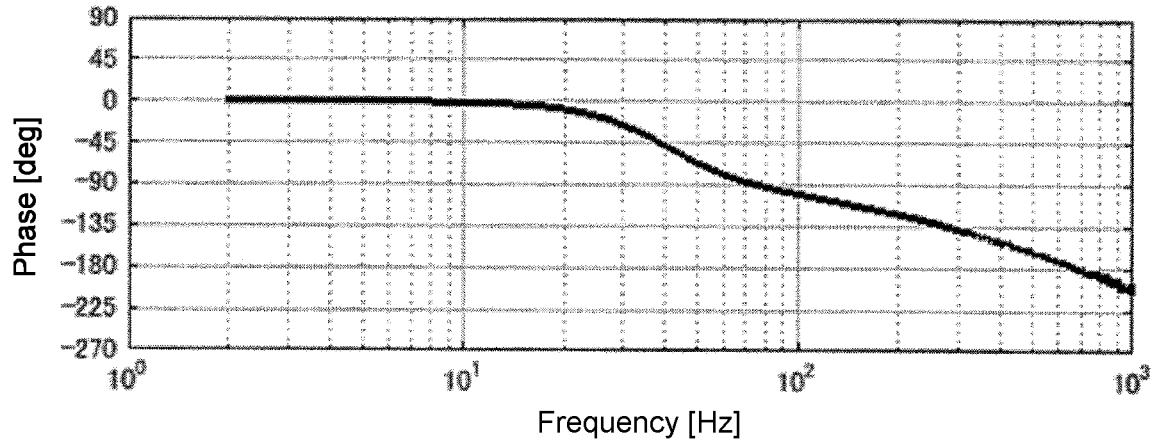
Figure 10:
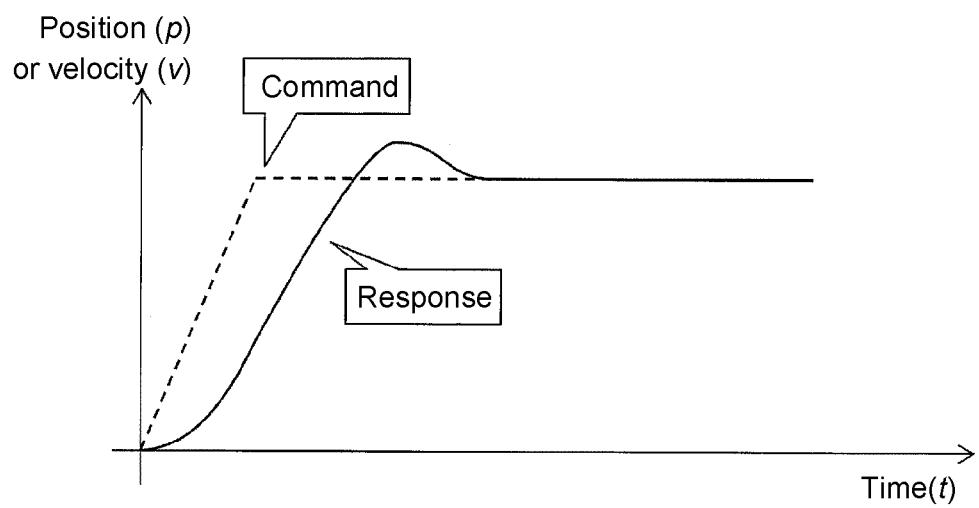
FIG. 10 is a diagram illustrating a time response (position or velocity).

The execution result of the simulation and the frequency response characteristic can be displayed on the display part 12 through the display control part 26 for example in a manner as shown in FIGS. 9a, 9b and FIG. 10 (S3-6).

Besides, if the result of the output time response simulation is better (YES in S3-6), then step S4 is performed, and if not good (NO in S3-6), then step S3 is repeated by returning back to S3-1.

In the actual mechanical response confirming step S4, at first, the control parameter when the response state is judged to be yes in S3-6 is set to the servo driver 2 (S4-1).

Next, the mechanical system 7 is actuated by the set control parameter to measure the response (S4-2).

Then, if the measured response is better (YES in S4-3), then the adjusting of the control parameter is ended. On the other hand, if the measured response is not good (NO in S4-3), then step S2-2 is performed.

As abovementioned, in the present embodiment, in order to adjust the control parameter (position gain, velocity gain, cut off frequency of the filter, etc.) of the servo driver 2, the time response of velocity control or position control is simulated and displayed to the user. Therefore, the user 5 can confirm the time response when the set control parameter is used by simulation and can safely adjust in short time without a need to repeatedly adjust the load device 4.

In addition, in the setting processing of the control parameter, the initial response step S1, the frequency response function computing step S2, the time response simulation executing step S3 and the actual machinery response confirming step S4 are set, but even if the actual machinery response confirming step S4 is not performed, the setting processing of the control parameter can still be performed. That is, by using the result simulation obtained by measuring the frequency response of the motor 3 and the load device 4, the simulation of the characteristic of the controlled object 6 can be precisely reflected, therefore, even if the actual machinery response confirming step S4 is not performed, the setting of the control parameter can still be finished.

[Details of the Display Control Part 26]

Next, details of the display control part 26 are explained with reference to FIGS. 9a, 9b and FIG. 10, which are diagrams displayed on the display part 12 through the display control part 26. Speaking in more detail, FIG. 9a is a diagram illustrating the gain characteristic of the frequency transfer function, and FIG. 9b is a diagram illustrating phase characteristic of the frequency transfer function. Besides. FIG. 10 is a diagram illustrating the time response (position or velocity).

The display control part 26 uses the velocity open-loop characteristic (frequency characteristic) $G_{v\_open}$, the velocity closed-loop characteristic (frequency characteristic) $G_{v\_closed}$, the position open-loop characteristic (frequency characteristic) $G_{p\_open}$ and the position closed-loop characteristic (frequency characteristic) $G_{p\_closed}$, which are computed by the simulation part 23 to generate a Bode line graph (at least any one of gain characteristic (gain response characteristic)) and phase characteristic (phase response characteristic). Besides, a simulation diagram illustrating a simulation result of the simulation part 23 for time response (position and velocity) is generated. Besides, both the Bode line graph and the simulation diagram generated by the display control part 26 are displayed on the display part on a display part simultaneously or selectively.

The Bode line graph of the gain characteristic can be generated by setting an x axis into a frequency f[N] and a y axis into $20 \cdot \log_{10}|G[N]|$.

Besides, the Bode line graph of the phase characteristic can be generated by setting the x axis into the frequency f[N] and a y axis into arg(G[N]).

Besides, the simulation diagram is a diagram setting the x axis into time (t) and the y axis into position (p) or velocity (v). In the example as shown in FIG. 10, by using a chart in which the x axis is time (t), the y axis is position (p) or velocity (v), a response result of the command (the position command and the velocity command) and simulation is overlapped and plotted to be displayed.

Therefore, the Bode line graph generated by the velocity open-loop characteristic $G_{v\_open}$, the velocity closed-loop characteristic $G_{v\_closed}$, the position open-loop characteristic $G_{p\_open}$ and the position closed-loop characteristic $G_{p\_closed}$ is displayed, therefore, the user can easily properly adjust the control parameters (velocity proportion gain, velocity integration gain, position proportion gain, etc.) of the position controller 31 and the velocity controller 32 of the servo driver 2.

Further, by displaying the simulation diagram of the time response, the user can easily learn a response result of the mechanical system 7 containing the load device 4.

Embodiment 2

[Simulation-2]

Another embodiment of the present invention is explained as follows based on FIG. 8d. In addition, in order to facilitate explanation, the members with the same functions as the members explained in the embodiment are marked with the same signs and the explanation is omitted.

As shown in FIG. 8d, in the present embodiment, the model current controller 33' and the mechanical model part 34' in the basic structure of simulation are replaced with a frequency transfer function (third frequency transfer function) for simulation to execute simulation.

That is, in simulation-2, the response position is fed back to the model position controller 31' by a model position feedback loop 31b' to compute a position deviation between a position command $p_{cmd}$ and a model response position $p_{sim}$, and the model position controller 31' uses the position deviation to generate a velocity command $v_{cmd}$. Then, the model velocity controller 32' generates a torque command $\tau_{cmd}$ according to a velocity deviation between the velocity command and a model response velocity ($v_{sim}$) fed back by the model velocity feedback loop 32b'. Then, the response velocity is computed according to the torque command and the third frequency transfer function, the computed response velocity is subjected integration to compute the response position, thereby performing simulation. Therefore, the feedback response velocity and the response position are used to compute the velocity deviation and the position deviation, therefore, the error of the low frequency components is reduced, and high prevision simulation can be performed.

In addition, the system containing the model velocity controller 32', the third frequency transfer function P (35c') and the model velocity feedback loop 32b' is called as model velocity feedback system (model feedback system) 32a'. Besides, the system containing the model velocity feedback system 32a', the model velocity controller 32' and the model position feedback loop 31b' is called as a model position feedback system (model feedback system) 31a'.

Specifically speaking, the simulation execution method is as follows. The simulation part 32 performs inverse Fourier transform on the frequency transfer function P in the following way to solve the impulse response $g_{imp}$, which represents a velocity response of the torque impulse command.

$$g_{imp}[N]=\text{IFFT}(P[N])$$

Next, the simulation part 23 solves the position response (time sequence arrangement $p_{sim}$) and the velocity response (time sequence arrangement) $v_{sim}$ relative to the position command (time sequence arrangement $p_{cmd}$), which is a convolution performing impulse response $g_{imp}$. In addition, $v_{cmd}$ is output from the model position controller 31', and $\tau_{cmd}$ is output from the model velocity controller 32'.

```
FOR repeating m=0 to a length quantity to be simulated DO
  p_err=p_cmd[m]−p_sim[m−1]...the position deviation p_err is calculated.
  v_cmd=K_pp·p_err
  v_err=v_cmd−v_sim[m−1]...the velocity deviation v_err is calculated.
  τ_cmd=K_vp·v_err
  FOR only repeating n=0 to a length quantity of g_v_imp DO
    v_sim[m+n]=τ_cmd·g_imp[n]...convolution
  ENDFOR
  p_sim[m]=psim[m−1]+v_sim[m]·Δt... the velocity is subjected to
integration to compute a position
ENDFOR
```

Herein, same as the embodiment 1, $K_{pp}$ is a position proportion gain (control parameter), $\Delta t$ is a sampling interval during frequency response measurement, and $K_{vp}$ is a velocity proportion gain (control parameter).

As abovementioned, in the present embodiment, the frequency transfer function (P) of the model current controller 33' and the mechanical model part 34' in the basic structure of the simulation system is taken as an object of inverse Fourier transform, and the position deviation and velocity deviation are used to execute simulation.

Besides, by using the position deviation and the velocity deviation, the error of the low frequency components contained in the frequency transfer function P is reduced, therefore, more accurate simulation can be executed compared with simulation-0.

Further, compared with simulation-1, the following effect is achieved. The constitution containing torque feedforward (for the model current controller 33', and the torque command plus the feedforward is taken as input) can be simulated. This is because in simulation-1, no torque command $\tau_{cmd}$ occurs, and thus the torque command $\tau_{cmd}$ cannot be added to the torque feedforward. In addition, the constitution of the feedforward is recorded in the following text as a third embodiment.

Besides, when the simulation when the control parameter of the model current controller 33' is not changed and only the control parameter of the model position controller 31' and that of the model velocity controller 32' is executed, since P (frequency transfer function of the system containing the model current controller 33' and the mechanical model part 34') is not changed, therefore, a handling capacity is reduced. This is because the inverse Fourier transform with a large computing amount is not required to be recomputed.

[Examples Realized by Means of Software]

The control block of the setting device 1 (especially the control part 10 (the parameter setting art 21, the frequency characteristic computing part 22 (the torque command generating part 51 for measurement, the velocity command generating part 52 for measurement, the frequency response function computing part 53 for measurement and the position command generating part 54 for measurement)), the simulation part 23 (the frequency transfer function setting part 40, the impulse response computing part 41, simulation system 42, the second command value generating part 43, the time response outputting part 44 and the frequency response outputting part 45), the actuation indicating part 24, the acquiring part 25 and the display control part 26) can be realized by a logic circuit (hardware) formed on an Integrated Circuit (IC chip) and can also be realized by using a Central Processing Unit (CPU) through software.

In the latter condition, the setting device 1 has: a CPU, executing a command of a program of software realizing each function; a Read Only Memory (ROM) or storage device (they are called as "recording medium"), recording the program and various data in a computer (or CPU)-readable manner; and a Random Access Memory (RAM) expanding the program. Besides, the objective of the present invention is finished by reading the program from the recording medium and executing the program through the computer (CPU). As the recording medium, "a non-temporary physical medium", for example, a tape, a disk, a card, a semiconductor memory, a programmable logic circuit, etc., can be used. Besides, the program can be provided to the computer through any transfer medium (communication network or radio waves) capable of transmitting the program. In addition, the present invention can be realized by embodying the program through electronic transfer in a form of a data signal embedded into carriers.

The present invention is not limited to each embodiment, and can be changed in many ways in the scope shown by claims, and the embodiments obtained by properly combining the technical means respectively disclosed in different embodiments also fall within a technical scope of the present invention.

What is claimed is:

1. A simulation device, simulating a mechanical system which has a controlled object containing a motor and a motor control device controlling the motor, comprising:
   a frequency response function computing circuit, computing a frequency response function containing characteristics of the controlled object based on a relation between a first command value driving the mechanical system and a measured value of response of the mechanical system driven by the first command value;
   a simulation circuit, having a control block structure corresponding to the mechanical system, the control block structure comprises a model position controller and a model velocity controller;
   a parameter setting circuit, setting control parameters changing characteristics of the simulation circuit;
   a frequency transfer function setting circuit, setting a velocity closed frequency transfer function or a position closed frequency transfer function computed based on the frequency response function and the control parameters representing characteristics of the model position controller and the model velocity controller into a frequency transfer function for simulation;
   an impulse response computing circuit, computing an impulse response by performing inverse Fourier transform on the frequency transfer function for simulation;
   a second command value generating circuit, generating a second command value for simulation;
   a time response outputting circuit, executing time response simulation of the mechanical system relative to the second command value based on the second command value and the impulse response;
   a frequency response outputting circuit, outputting the frequency response characteristic of the mechanical system based on the frequency transfer function for simulation; and a display control circuit, displaying a result of the time response simulation and the frequency response characteristic on a display part simultaneously or selectively.

2. The simulation device according to claim 1, wherein the time response outputting circuit outputs a result of time response simulation of at least any one of a position, velocity and torque of the mechanical system as the result of the time response simulation.

3. The simulation device according to claim 1, wherein the frequency response outputting circuit outputs at least one of a gain response characteristic and a phase response characteristic relative to the second command value as the frequency response characteristic.

4. The simulation device according to claim 1, wherein the mechanical system has a position feedback system containing a position controller and a velocity feedback system containing a velocity controller configured on a downstream side of the position controller as control block structure, the simulation circuit has a model position feedback system corresponding to the position feedback system and a model velocity feedback system corresponding to the velocity feedback system, and the frequency response outputting circuit outputs frequency response characteristic of at least any one of a velocity open-loop characteristic, a velocity closed-loop characteristic, a position open-loop characteristic and a position closed-loop characteristic as the frequency response characteristic.

5. The simulation device according to claim 1, wherein the first command value is a torque command value representing a torque, and the frequency response function computing circuit computes the frequency response function based on a relation between the torque command value and a velocity measured value of the response of the mechanical system driven by the torque command value.

6. The simulation device according to claim 1, wherein the first command value is a velocity command value representing a velocity, and the frequency response function computing circuit computes the frequency response function based on a relation between the velocity command value and a velocity measured value of the response of the mechanical system driven by the velocity command value.

7. The simulation device according to claim 1, wherein the first command is a position command value representing a position, and the frequency response function computing circuit computes the frequency response function based on a relation between the position command value and a position measured value of the response of the mechanical system driven by the position command value.

8. A simulation method, performing simulation of a mechanical system which has a controlled object containing a motor and a motor control device controlling the motor, comprising:

a frequency response function computing step, computing a frequency response function containing characteristics of the controlled object based on a relation between a first command value driving the mechanical system and a measured value of response of the mechanical system driven by the first command value;

a parameter setting step, setting control parameters changing characteristics of a simulation circuit having a control block structure corresponding to the mechanical system;

a frequency transfer function setting step, setting a velocity closed frequency transfer function or a position closed frequency transfer function computed based on the frequency response function and the control parameters into a frequency transfer function for simulation;

an impulse response computing step, computing an impulse response by performing inverse Fourier transform on the frequency transfer function for simulation;

a second command value generating step, generating a second command value for simulation;

a time response outputting step, executing time response simulation of the mechanical system relative to the second command value based on the second command value and the impulse response;

a frequency response outputting step, using the frequency transfer function for simulation to output frequency response characteristic of the mechanical system; and a display control step, displaying a result of the time response simulation and the frequency response characteristic on a display part simultaneously or selectively.

9. A non-transitory recording medium recording a control program, when the control program is executed, causing a computer having a processor to act as a simulation device to perform operations that simulates a mechanical system which has a controlled object containing a motor and a motor control device controlling the motor, and the operations comprises:

computing a frequency response function containing characteristics of the controlled object based on a relation between a first command value driving the mechanical system and a measured value of response of the mechanical system driven by the first command value;

setting control parameters changing characteristics of a simulation system having a control block structure corresponding to the mechanical system;

setting a velocity closed frequency transfer function or a position closed frequency transfer function computed based on the frequency response function and the control parameters into a frequency transfer function for simulation;

computing an impulse response by performing inverse Fourier transform on the frequency transfer function for simulation;

generating a second command value for simulation;

executing time response simulation of the mechanical system relative to the second command value based on the second command value and the impulse response;

using the frequency transfer function for simulation to output frequency response characteristic of the mechanical system; and displaying a result of the time response simulation and the frequency response characteristic on a display part simultaneously or selectively.

\* \* \* \* \*